United States Patent
Rateiczak et al.

(10) Patent No.: US 9,155,206 B2
(45) Date of Patent: Oct. 6, 2015

(54) SOLDER CONNECTION ELEMENT

(75) Inventors: Mitja Rateiczak, Wuerselen (DE);
Bernhard Reul, Herzogenrath (DE);
Cornelia Retsch, Aachen (DE)

(73) Assignee: SAINT-GOBAIN GLASS FRANCE,
Aubervillers (FR)

( * ) Notice: Subject to any disclaimer, the term of this patent is extended or adjusted under 35 U.S.C. 154(b) by 205 days.

(21) Appl. No.: 12/744,054

(22) PCT Filed: Dec. 5, 2008

(86) PCT No.: PCT/EP2008/010314
§ 371 (c)(1),
(2), (4) Date: Sep. 9, 2010

(87) PCT Pub. No.: WO2009/074264
PCT Pub. Date: Jun. 18, 2009

(65) Prior Publication Data
US 2010/0319977 A1    Dec. 23, 2010

(30) Foreign Application Priority Data

Dec. 11, 2007  (DE) .......................... 10 2007 059 795
Jun. 25, 2008  (DE) .......................... 10 2008 030 101

(51) Int. Cl.
*H05K 1/11*      (2006.01)
*H01R 12/00*     (2006.01)
(Continued)

(52) U.S. Cl.
CPC .. *H05K 3/32* (2013.01); *H05B 3/84* (2013.01); *H01R 4/02* (2013.01);
(Continued)

(58) Field of Classification Search
CPC ................................. H05B 3/84; H01R 13/055
USPC .................. 174/251, 261, 94 R; 228/180.22;
439/83, 507, 77, 79, 80, 81, 883, 884,
439/891, 872, 888; 219/203
See application file for complete search history.

(56) References Cited

U.S. PATENT DOCUMENTS 2,502,147 A    3/1950   Grothouse
2,644,066 A    6/1953   Glynn
(Continued)

FOREIGN PATENT DOCUMENTS

CA    1004271    1/1977
DE    1936780    2/1970
(Continued)

OTHER PUBLICATIONS

PCT International Search Report for PCT/EP2008/010314 filed on Dec. 5, 2008 in the name of Saint-Gobain Glass France.
(Continued)

*Primary Examiner* — Chau N Nguyen
*Assistant Examiner* — Roshn Varghese
(74) *Attorney, Agent, or Firm* — Steinfl & Bruno LLP

(57) ABSTRACT

In a solder connection element (1), which is intended in particular for soldering onto a brittle substrate such as a window pane, for connecting an electrical component, which solder connection element has a body (2) provided for connecting purposes and at least two solder feet (3) protruding therefrom, a respective elastically deformable connecting part which is suitable for accommodating differences in thermal expansion extending between the body and the solder feet, more than two solder feet (3) are provided according to the invention for soldering onto a surface, wherein differences in thermal expansion and effects of mechanical forces from the component to be connected can be accommodated in at least two coordinate directions parallel to the substrate surface by way of resilience of the solder feet (3) and/or the connecting parts relative to the body (2) and/or the solder connection element (1). The body (2) itself can also be configured so as to be resilient by way of incisions (6) and/or equipped with a plug-in lug (5).

21 Claims, 2 Drawing Sheets

(51) Int. Cl.
*H05K 1/00* (2006.01)
*H01R 11/11* (2006.01)
*H01R 9/24* (2006.01)
*H01R 13/02* (2006.01)
*H05K 3/32* (2006.01)
*H05B 3/84* (2006.01)
*H01R 4/02* (2006.01)
*H05K 1/03* (2006.01)
*H05K 3/34* (2006.01)

(52) U.S. Cl.
CPC ....... *H05B 2203/016* (2013.01); *H05K 1/0306* (2013.01); *H05K 3/3421* (2013.01); *H05K 2201/0979* (2013.01); *H05K 2201/1031* (2013.01); *H05K 2201/10962* (2013.01)

(56) References Cited

U.S. PATENT DOCUMENTS

| | | | |
|---|---|---|---|
| 2,709,211 A | 5/1955 | Glynn | |
| 3,615,986 A | 10/1971 | Dickason et al. | |
| 3,616,122 A | 10/1971 | Orcutt et al. | |
| 3,634,654 A | 1/1972 | Aachen et al. | |
| 3,926,357 A | 12/1975 | Matrisian | |
| 4,023,008 A * | 5/1977 | Durussel | 219/522 |
| 4,213,028 A | 7/1980 | Wolf | |
| 4,488,033 A | 12/1984 | Trachtenberg | |
| 4,555,607 A | 11/1985 | Roentgen et al. | |
| 4,629,278 A | 12/1986 | Norton et al. | 339/134 |
| 4,707,591 A | 11/1987 | Sprenger | |
| 4,721,845 A | 1/1988 | Kunert et al. | |
| 4,827,611 A | 5/1989 | Pai et al. | 29/843 |
| 4,853,520 A | 8/1989 | Hochart et al. | |
| 4,918,288 A | 4/1990 | Carter et al. | |
| 5,023,403 A * | 6/1991 | Eckardt et al. | 174/94 R |
| 5,053,357 A | 10/1991 | Lin et al. | 437/204 |
| 5,134,248 A | 7/1992 | Kiec et al. | |
| 5,367,124 A * | 11/1994 | Hoffman et al. | 174/552 |
| 5,462,443 A * | 10/1995 | Kurbjuhn et al. | 439/78 |
| 5,501,353 A | 3/1996 | Warren | |
| 5,534,879 A | 7/1996 | Braun et al. | |
| 5,610,436 A | 3/1997 | Sponaugle et al. | 257/669 |
| 5,705,848 A * | 1/1998 | Bayerer | 257/724 |
| 5,738,554 A | 4/1998 | Borger et al. | |
| 5,748,155 A | 5/1998 | Kandunce et al. | |
| 5,867,128 A | 2/1999 | Sauer | |
| 5,897,406 A | 4/1999 | Benes et al. | |
| 5,897,964 A | 4/1999 | White et al. | |
| 5,902,536 A | 5/1999 | Shumaker, Jr. et al. | |
| 6,103,034 A | 8/2000 | Fujiwara et al. | |
| 6,103,998 A | 8/2000 | Kuno et al. | |
| 6,103,999 A | 8/2000 | Nishio et al. | |
| 6,217,373 B1 | 4/2001 | Johnston | |
| 6,262,474 B1 * | 7/2001 | Kobayashi et al. | 257/784 |
| 6,307,515 B1 | 10/2001 | Sauer et al. | |
| 6,396,026 B2 | 5/2002 | Gillner et al. | |
| 6,406,337 B1 | 6/2002 | Machado | |
| 6,421,018 B1 | 7/2002 | Zeilinger et al. | |
| 6,534,720 B2 | 3/2003 | Von Alpen et al. | |
| 6,580,369 B1 | 6/2003 | Eberhardt et al. | |
| 6,638,075 B2 | 10/2003 | Spaulding et al. | |
| 6,793,120 B2 | 9/2004 | Johnson | |
| 6,834,969 B2 | 12/2004 | Bade et al. | |
| 7,134,201 B2 | 11/2006 | Ackerman et al. | |
| 7,180,031 B1 | 2/2007 | Loibl et al. | |
| 7,223,939 B2 | 5/2007 | Hoepfner et al. | |
| 7,247,047 B2 | 7/2007 | Baranski et al. | |
| 7,270,548 B2 | 9/2007 | Jenrich et al. | |
| 7,344,059 B2 | 3/2008 | Johnson | |
| 7,514,654 B2 | 4/2009 | Okajima et al. | |
| 7,675,004 B2 | 3/2010 | Nakajima et al. | |
| 7,909,665 B2 | 3/2011 | Lyon | |
| 8,109,782 B2 | 2/2012 | Ziegler et al. | |
| 8,240,940 B2 | 8/2012 | Strohheker | |
| 8,277,244 B2 | 10/2012 | Ziegler et al. | |
| 2002/0001997 A1 * | 1/2002 | Reul | 439/422 |
| 2002/0111081 A1 | 8/2002 | Machado | |
| 2003/0034172 A1 | 2/2003 | Von Alpen et al. | |
| 2003/0155467 A1 | 8/2003 | Petrenko | |
| 2005/0112291 A1 | 5/2005 | Okajima et al. | |
| 2005/0115954 A1 | 6/2005 | Gerhardinger et al. | |
| 2005/0269312 A1 | 12/2005 | Gerhardinger et al. | |
| 2006/0102610 A1 | 5/2006 | Hoepfner et al. | |
| 2006/0228953 A1 | 10/2006 | Pereira et al. | |
| 2007/0054553 A1 | 3/2007 | Nishio et al. | |
| 2007/0224842 A1 | 9/2007 | Hoepfner et al. | |
| 2007/0235860 A1 | 10/2007 | Steger et al. | |
| 2008/0164248 A1 | 7/2008 | Reul | |
| 2008/0263973 A1 | 10/2008 | Lenhardt | |
| 2009/0277671 A1 | 11/2009 | Hahn | |

FOREIGN PATENT DOCUMENTS

| | | |
|---|---|---|
| DE | 2364811 | 7/1974 |
| DE | 85 16 807.6 | 9/1985 |
| DE | 9013380 U1 | 11/1990 |
| DE | 9313394 | 10/1993 |
| DE | 4304788 | 8/1994 |
| DE | 19856663 | 6/2000 |
| DE | 10046489 | 12/2001 |
| DE | 102004/057630 | 3/2006 |
| DE | 2364811 | 11/2006 |
| DE | 102005016650 | 11/2006 |
| DE | 102006017675 | 10/2007 |
| DE | 202008015441 | 4/2010 |
| DE | 102009016353 | 10/2010 |
| EP | 0023121 | 1/1981 |
| EP | 0488878 | 6/1992 |
| EP | 0593940 | 4/1994 |
| EP | 0720253 | 7/1996 |
| EP | 0766338 | 4/1997 |
| EP | 0 780 927 | 6/1997 |
| EP | 0848449 | 6/1998 |
| EP | 1119071 | 7/2001 |
| EP | 1488972 | 12/2004 |
| EP | 1488972 A | 12/2004 |
| EP | 1657964 | 5/2006 |
| EP | 1713124 A | 10/2006 |
| FR | 1104595 | 11/1955 |
| FR | 2212734 | 7/1974 |
| GB | 1163224 | 9/1969 |
| GB | 1449479 | 9/1976 |
| JP | 4015186 | 2/1992 |
| JP | 7053272 | 2/1995 |
| JP | 7220901 | 8/1995 |
| JP | 7335280 | 12/1995 |
| JP | 9180769 | 7/1997 |
| JP | 3093932 | 5/2003 |
| WO | 98/47200 | 10/1998 |
| WO | 2004/009350 | 1/2004 |
| WO | 2004/068643 | 8/2004 |
| WO | 2007/110610 | 10/2007 |
| WO | 2010/057641 | 5/2010 |

OTHER PUBLICATIONS

PCT Written Opinion for PCT/EP2008/010314 filed on Dec. 5, 2008 in the name of Saint-Gobain Glass France.
International Search Report for PCT Application No. PCT/EP08/10322 Filed on May 12, 2008 in the name of Saint Gobain Glass France; mail date: Nov. 3, 2009.
Written Opinion for PCT Application No. PCT.EP08/10322 filed on May 12, 2008 in the name of Saint Gobain Glass France; mail date: Nov. 3, 2009.
Non-Final Office Action issued for U.S. Appl. No. 12/744,052, filed Aug. 6, 2010 in the name of Bernhard Reul; mail date: Apr. 4, 2012.
Final Office Action issued for U.S. Appl. No. 12/744,052, filed Aug. 6, 2010 in the name of Bernhard Reul; mail date: Aug. 9, 2012.
International Search Report for PCT Application No. PCT/EP2008/007878 Filed on Jul. 1, 2010 in the name of Saint Gobain Glass France; mail date; Sep. 3, 2009. English Abstract.

(56) References Cited

OTHER PUBLICATIONS

Written Opinion for PCT Application No. PCT/EP2008/007878 Filed on Jul. 1, 2010 in the name of Saint Gobain Glass France; mail date; Sep. 3, 2009.
Non-Final Office Action issued for U.S. Appl. No. 12/678,284, filed Jul. 1, 2010 in the name of Ziegler, S. et al.; mail date: Apr. 4, 2011.
Final Office Action issued for U.S. Appl. No. 12/678,284, filed Jul. 1, 2010 in the name of Ziegler, S. et al.; mail date: Aug. 9, 2011.
Notice of Allowance issued for U.S. Appl. No. 12/678,284, filed Jul. 1, 2010 in the name of Ziegler, S. et al.; mail date: Oct. 14, 2011.
Non-Final Office Action issued for U.S. Appl. No. 13/341,714, filed Dec. 30, 2011 in the name of Stefan Ziegler; mail date: Mar. 23, 2012.
Notice of Allowance issued for U.S. Appl. No. 13/341,714, filed Dec. 30, 2011 in the name of Stefan Ziegler; mail date: May 24, 2012.
Notice of Allowance issued for U.S. Appl. No. 13/341,714, filed Dec. 30, 2011 in the name of Stefan Ziegler; mail date: Jul. 18, 2012.
European Search Report for European Application No. 10155181.0 filed in the name of Saint-Gobain Glass France; mail date: Dec. 2, 2010.
European Search Report for European Application No. 10157516.5 filed in the name of Saint-Gobain Glass France; mail date: Aug. 4, 2010.
European Search Report for European Application No. 10169372.9 filed in the name of Saint-Gobain Glass France; mail date: Dec. 20, 2010.
European Search Report for European Application No. 11165501.5 filed in the name of Saint-Gobain Glass France; mail date: Oct. 13, 2011.
European Search Report for European Application No. 11165504.9 filed in the name of Saint-Gobain Glass France; mail date: Oct. 21, 2011.
European Search Report for European Application No. 11165506.4 filed in the name of Saint-Gobain Glass France; mail date: Oct. 21, 2011.
Non-Final Office Action mailed on Jan. 30, 2013 for U.S. Appl. No. 13/595,383 filed in the name of on Stefan Ziegler et al. Aug. 27, 2012.
Notice of Allowance mailed on May 13, 2013 for U.S. Appl. No. 13/595,383 filed in the name of on Stefan Ziegler et al. Aug. 27, 2012.
Notice of Allowance mailed on Apr. 12, 2013 for U.S. Appl. No. 12/744,052 filed in the name of on Bernhard Reul Aug. 6, 2010.

\* cited by examiner

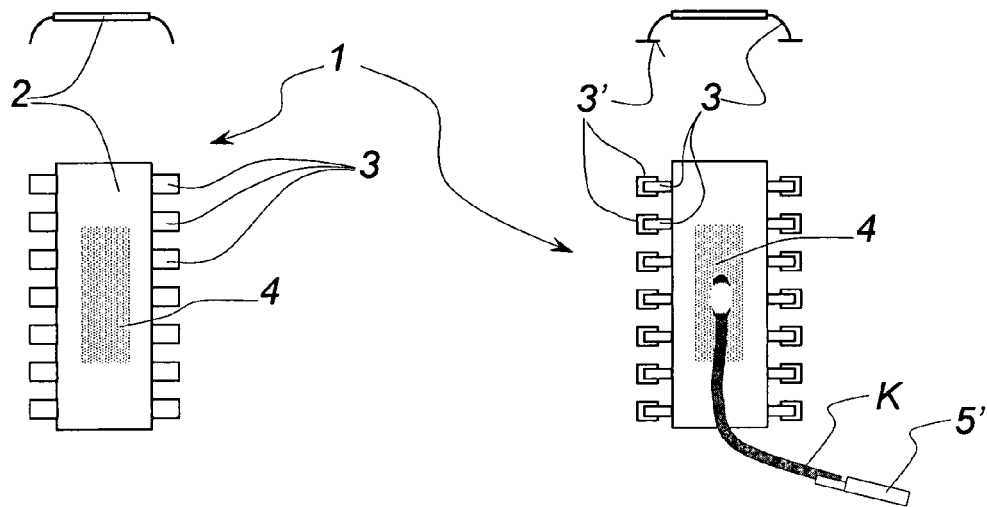
Fig. 1  Fig. 2
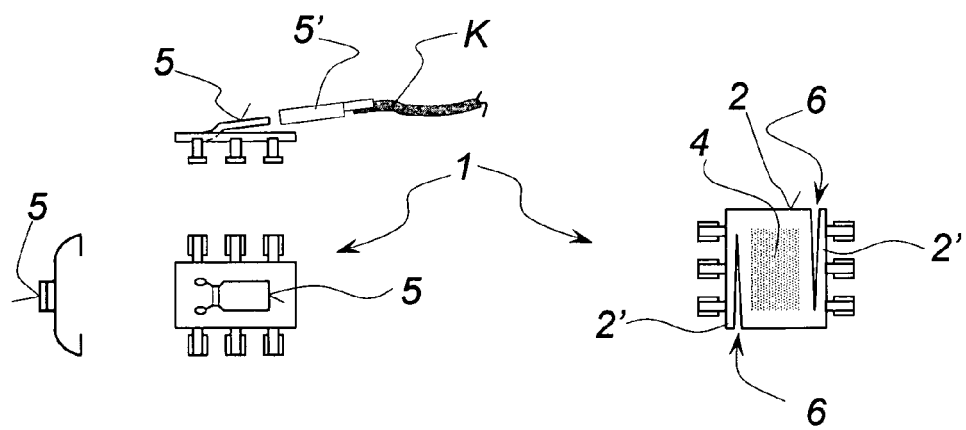
Fig. 3  Fig. 4
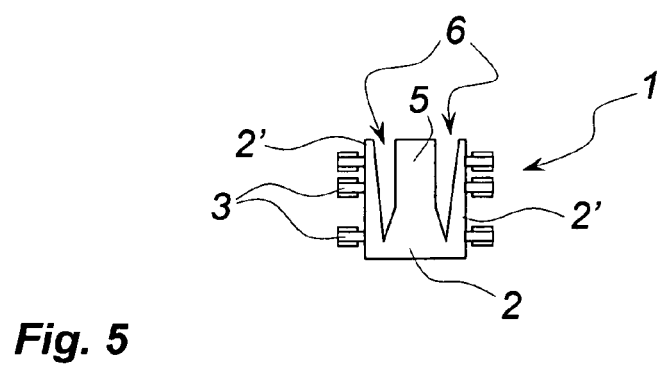
Fig. 5

SOLDER CONNECTION ELEMENT

CROSS REFERENCE TO RELATED APPLICATIONS

The present application is the US national stage of International Application PCT/EP2008/010314 filed on Dec. 5, 2008 which, in turn, claims priority to German Application 102007059795.0, filed on Dec. 11, 2007 and German Application 102008030101.9, filed on Jun. 25, 2008.

The invention relates to a solder connection element having the features of the preamble of claim 1. In particular, the invention relates to solder connection elements which are provided for soldering onto brittle substrates, in particular onto panes of glass equipped with electrical conductive structures, and have to allow compensation between different thermal expansion properties of the glass on the one hand and of the soldered metal on the other hand.

DE 90 13 380 U1 discloses a current connection element for a heatable car windscreen, which element consists substantially of a resilient braid and a solder foot which is made of copper sheet and securely connected thereto. In the preferred embodiment, said solder foot is provided with two separate solder surfaces and a cranked bridge part extending therebetween. The cranks of this bridge part compensate, by way of elastic deformability, for stresses which can build up as a result of differing thermal expansions of the glass and sheet metal part both during the soldering process itself and during operation of the heatable car windscreen.

As is known, current connection elements of this type can be configured not only with securely welded-on line portions, but rather also with plug-in lugs or with push-buttons for the detachable connection of lines.

DE 100 46 489 C1 discloses a solderable electrical connection element in which a solder deposit is fixed by means of an insertion piece to a connection surface to be soldered. This insertion piece can be configured as a multiple-toothed crimped part. However, this document does not examine the aspect of compensation for differences in thermal expansion; nor do the teeth of the crimped part serve as connecting feet.

To a certain extent, conventional soldering processes compensate for the mechanical stresses in addition by the selection of the (lead-containing) alloy of the soft solder metal which is located in a more or less thick layer between the pane surface or the conductive structure applied thereto on the one hand and the soldered-on metal part. Even when solid, these solders remain comparatively soft or ductile and can buffer or compensate for mechanical stresses by way of creepage.

With the demand for lead-free solders which, although per se readily solderable, are much less ductile, there is in the above-discussed connection cases an increased risk of the build-up of internal stresses, which build-up could lead to increased wastage once the solder connection has been established, if said connection is configured using the conventional solder connection elements and the capacity of said elements should not be sufficient to break down or to compensate for stresses.

Whereas thermally prestressed glass panes are less susceptible in this regard, damage can occur in composite panes, consisting of non-prestressed glass panes, above all when the individual panes are made of relatively thin glass. Individual panes which are less than 2 mm thick are used in modern composite glass production above all to reduce the total weight of the finished pane and of course also to reduce the overall thickness thereof.

Generally speaking, the connection elements of car windscreens are pre-equipped for immediate connection without the use of tools once the windscreen has been inserted into the associated bodywork opening, i.e. the windscreen manufacturer has to integrate all the connection elements with cross-sectional transitions (from the flat conductor to the round cable) and plugs into the composite.

These connection elements are relatively expensive. Thus, undesirable additional losses in value can occur if, after the final production of the composite, not only the panes per se but rather also the connection elements, which are connected thereto in a non-reusable manner, have to be scrapped.

It is known from microelectronics to electrically contact components (memory modules, microchips) to the associated printed circuit boards using a large number of solder feet. However, this focuses on optimally secure contacting of various electrical terminals, whereas compensation for any differences in thermal expansion in the solder region in unipolar connections plays no part in these known modules. Regardless of this, no significant currents are conducted in these connections, whereas in the applications in question, for example in heatable car windscreens at on-board voltages from approximately 12 to 14 V of DC voltage, currents of more than 200 A can flow.

The invention is based on the object of providing solder connection elements with which, in a simple and inexpensive embodiment, increased loading of the pane surface with stresses resulting from soldering in situ, i.e. on the pane surface, can be substantially minimized. Furthermore, an object is that a connector needs to be connected to a substrate by a soldering material which does not contain lead and yet provides the common valuable characteristics of the connection.

According to the invention, this object is achieved by the features of Claim 1. The features of the sub-claims disclose advantageous embodiments of this invention.

An increased breakdown of the solder surface as a whole into a plurality of small contact surfaces having a mechanically comparatively weak individual connection to the body of the solder connection element allows stresses to be compensated for not only in a main direction, but rather two-dimensionally in the overall area of the solder contacting (i.e. in the main application on a window pane surface). At the same time, however, a large number, the extent of which depends on the nominal current of the connection to be soldered, of connections or solder feet ensures that no local overheating occurs. These solder feet can have only tips or else small solder surfaces, as required. What matters in this case is, inter alia, the amount of solder available for each solder foot and the space conditions around each individual solder foot. Nor is a uniform distribution of the large number of solder feet important in this regard.

Depending on the configuration of the body (material, dimensions, thickness), the body itself can also be configured with portions which are deformable in order to compensate for stresses. For example, it is possible to form in a sheet metal body incisions which can expand or contract again in the event of stresses.

In a manner known per se, the body can form and/or comprise any form of connection element. It will often be combined with a portion of a flexible line. In a manner known per se, a flexible line portion of this type can be securely connected, for example welded, to the body, whereas its free end is provided with a plug-in contact. However, it is also possible to make solder connection elements with bodies which are suitable for directly mounting (attaching, soldering, bonding) an electrical or electronic component, for example a choke coil for an antenna connection.

The body, the connecting parts and the solder feet can be configured in one piece or in a plurality of pieces (assembled). In the case of an embodiment in a plurality of pieces, the body and the solder feet can be made of differing materials. Furthermore, the body can be sheathed with an insulating material, provided that it does not have to offer free connection surfaces.

As solder connection elements of this type are mass-produced parts, the ability to produce them cost-effectively will be particularly important. One-piece variants made of punchable and bendable/foldable sheet metal material are above all expedient in this regard. However, for smaller quantities and/or special cases, more complex variants are also entirely conceivable given specific use requirements.

Specifically, the following embodiments are possible:

Crimped round braid: a round braid adapted to the flow of current and a crimp connector with a solder deposit known per se can be processed automatically. Compared to the conventional connection, the connection area is reduced to <=15 mm$^2$. The amount of solder must be adapted in such a way as to produce during soldering a solder fillet running continuously (in a well-rounded manner).

Rounding-out of the solder connection element: the known embodiments are conventionally bent in an angular manner. This also produces hard stress transmission points at the solder joint. A rounder, continuous shape of the solder connection element allows greater flexibility in the connection material and more generously defined stress transmission limits. The actual points of contact of the connection to glass should in this case be minimized. <=15 mm$^2$ is aimed at overall. In this case too, a continuous and ampler course of the solder fillet should be ensured.

Incisions in the body of the solder connection element: unlike in the known rigid, one-piece bridge foot, the body is incised (sawn, punched) so as to separate the bridge foot into two parts which are then joined together only via the flat braid. In this case too, the individual solder area should be <=15 mm$^2$. The course of the solder fillet should be continuous.

Thinner material: conventional solder contact feet use a material thickness of 0.8 mm, as this is standardized for many forms of plug-in connection. If half the material thickness, or the material thickness reduced to a third, is used and, for the plug-in connection, the material is folded to the standardized thickness, the rigidity of the connection in the relevant region and thus the stresses which occur are reduced. The material thickness according to the invention of the solder feet is between 0.01 mm and 0.4 mm.

Connection in series in plastics material housing: For signal transmission, there is already a connection which arranges a plurality of individual contacts in a spatially fixed positional relationship to one another in a plastics material housing and thus allows the soldering to be carried out in a single operation (induction soldering). However, these individual connections can also "hang" in series or parallel from a single, current-supplying braid and ensure sufficient current transmission by way of the multiple contacting. At the same time, these numerous individual connections do not form a rigid structure (connected only via cables and if appropriate a plastics material housing) and as a result reduce the stresses applied. Again, the individual solder area should be <=15 mm$^2$. The course of the solder fillet should be continuous.

Further details and advantages of the subject matter of the invention will emerge from the drawings of a plurality of exemplary embodiments and the following in-depth description thereof.

In simplified illustrations which are not true to scale:

FIG. 1 shows two views, tilted through 90° relative to each other, of a first embodiment of a solder connection element with a large number of solder feet having tips and a connection surface on the upper side of the body;

FIG. 2 shows two views, tilted through 90° relative to each other, of a second embodiment of a solder connection element which is configured in a similar manner to that in FIG. 1 and has a large number of solder feet with attached solder surfaces;

FIG. 3 shows two additional views, each tilted through 90° for the purposes of illustration, of a third embodiment of the solder connection element with a plug-in lug released from the sheet metal body;

FIG. 4 shows a fourth embodiment of the solder connection element, the body of which is provided with incisions for compensating for stresses;

FIG. 5 shows a fifth embodiment as a variant to FIG. 4, in which the incisions form between them a plug-in lug;

Figure 6:
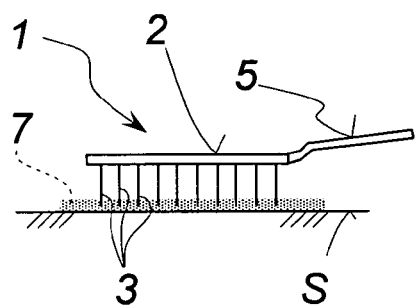
FIG. 6 shows a sixth embodiment of the solder connection element, the solder feet of which are configured as pins having tips.

According to FIG. 1, a solder connection element 1 comprises a body 2 and a large number of solder feet 3 which are located at the longitudinal sides of the rectangular body 2. On the upper side of the body 2 that is remote from the solder feet, indicated in shading is a connection surface 4 which is available for all conceivable connection options including direct attachment of an electrical and/or electronic functional element (not shown).

It should be noted that, in this case and in the further embodiments, no connecting parts are provided in a separate sense, but rather that the solder feet themselves are sufficiently small and resilient and thus themselves can form the resilient connecting parts between the body and the actual solder joint. It is also important that the solder feet are resilient in all directions, so that the purpose, which the invention seeks to achieve, of at least two-dimensional compensation for stresses is fulfilled. It can in particular also be advantageous if the solder feet are resilient per se also in the vertical direction, i.e. perpendicularly to the surface of the substrate onto which the solder connection element is to be soldered. That is to say, this also allows inherent arching of the substrate (for example an arched vehicle windscreen) to be compensated for to a limited extent in that all solder feet or the tips thereof can be brought into touching contact with the substrate surface even before soldering by pressing on the solder connection element.

It should also be noted that the solder feet do not, in a departure from the present view and also from the following views, necessarily have to be distributed uniformly along the lateral edges of the body, but rather can also be separated by differing distances. In addition, in a rectangular solder connection element, solder feet of this type can also be attached to the short sides. The more bridge-like configurations shown in the present document do not in any way rule that out. Also, the bodies of the solder connection elements do not have to be rectangular throughout, but rather can in principle also have completely different contours (triangular and polygonal, round, oval, etc.), without departing from the functional principle.

FIG. 2 shows a modification of the first embodiment in that solder surfaces 3', which increase the size of the contact base and allow this solder connection element 1 to be soldered by means of a very thin solder layer (optionally a pretinning), are attached to the tips of the solder feet 3. The fact that these solder surfaces 3' are somewhat wider than the actual solder feet 3 (which may be regarded in this case also as the aforementioned connecting parts between the body 2 and the solder surfaces 3') contributes on the one hand to the desired resilience of the "connecting parts", on the other hand to a connection or contact area on the substrate side that is increased in size and can be treated with a thin solder layer.

The relatively large number of solder feet 3 allows these solder connection elements 1 from FIGS. 1 and 2 to be used also for high currents, for example for electrically contacting windscreen heaters. In FIG. 2 a cable portion K, which is provided at its free end with a flat plug connector 5' or the like, is securely soldered or welded to the solder connection element 1.

In FIG. 3 the solder connection element 1 is configured, in modification to the two foregoing embodiments, with its own plug-in lug 5 which can easily be released from the sheet metal body 2. Two tilted views illustrate the outer form of this solder connection element. Indicated in the upper view is in addition a cable end K having a flat plug-in contact 5' which can be attached to the plug-in lug 5. The cable K can also be equipped, as in FIG. 2, at its other end with a plug connector (not shown here). Although in this case a smaller number of solder feet are provided and the solder connection element is overall smaller than the two embodiments discussed hereinbefore, high currents may still be conducted in this way.

The solder connection element 1 can in this embodiment be punched in one piece out of a sheet metal strip. The plug-in lug 5 can be released simultaneously with the punching process or else before/after it. Then, the solder feet 3 are bent down and the solder surfaces 3' inwardly folded back therefrom. Obviously, the solder surfaces 3' could also be outwardly folded back, but this would take up more space than the version shown here. Furthermore, the six solder feet 3 with folded-down solder surfaces 3' ensure that mechanical and thermal expansion stresses are accommodated and compensated for without jeopardizing quality of the soldering of this solder connection element.

In a fourth embodiment of the solder connection element 1 according to FIG. 4, although the solder feet are configured in accordance with the embodiment from FIG. 3, in this case the body 2 is additionally provided, by way of two opposing incisions 6, with resilient portions 2' (along the lateral edges on which the solder feet 3 are arranged). The fact that the incisions in this case oppose each other causes substantially uniform compensation for stresses toward both (longitudinal) sides of the solder connection element. These incisions 6, or the body portions 2' formed thereby, can undergo slight deformation under the influence of stresses acting thereon without jeopardizing the quality of the soldering to the tips or surfaces of the solder feet. However, at the same time, the body 2 of this embodiment also still has a sufficiently large surface 4 to attach the respectively required contact means. However, in a departure therefrom, it could also be provided with a plug-in lug corresponding to FIG. 3, which would have to be placed between the two incisions 6.

In addition, it would also be conceivable to form, in a modification thereto, a plug-in lug 5 out of the body 2 directly by way of expansion incisions 6. An embodiment of this type is outlined in FIG. 5. In this embodiment, the incisions 6 must of course form free spaces having a sufficient gap width to insert an appropriate flat plug connector—for example in the embodiment indicated in FIG. 3. If necessary, in this case too, the (substrate-remote) upper side of the plug-in lug could also offer a connection surface as in the embodiments discussed hereinbefore.

It will be noted that in this case the solder feet 3 are set apart from one another by differing distances on both sides of the solder connection element 1. This is intended to achieve two technical effects. On the one hand, the flow of current is distributed in the portions 2' of the body 2, which portions are relatively narrow at the end side. On the other hand, this in some way compensates for the fact that the body 2 is somewhat more rigid in the region of the inner end of the incisions 6 which in this case run in the same direction. As a result of the increased distance between the solder feet 3 in this region, said solder feet are on the whole somewhat less durable than the solder feet, which are positioned closer together, in the region of the open ends of the incisions 6. It will be understood that a solder connection element of this type can if necessary also be configured with a larger number of solder feet—for example, as in FIG. 1 or 2.

In any case, as a result of the overall resilience available at the solder feet 3 and in the incisions, this embodiment also ensures good resistance of the solder connections to differences in thermal expansion. At the same time, a very simple design, which is compact in particular with regard to the plug-in connection, of the solder connection element is achieved, as in the embodiment according to FIG. 3.

FIG. 6 shows still a further variant which is reminiscent, purely in visual terms, of a bed of nails. Numerous pins, the large number of which produces the cross section required for the conduction of current, are attached to the body 2 as solder feet 3. An embodiment of this type will be inserted into a planar solder bath 7 which is prepared on the indicated surface of a substrate S, so that all tips of the pins are reliably contacted and a sufficiently effective cross section is available for the conduction of current. In this case, it is advantageous if the body 2 is relatively resilient/bendable, thus allowing limited flexibility in terms of height of the solder connection element to be ensured.

In this embodiment, a plug-in lug 5 is moulded (preferably in one piece) onto at least one end side of the body 2. Obviously, in a departure from the illustration, this provision could also be made in the other embodiments. It is also entirely possible for a plurality of plug-in lugs or similar connection elements or surfaces to be provided on a single solder connection element.

Figure 7:
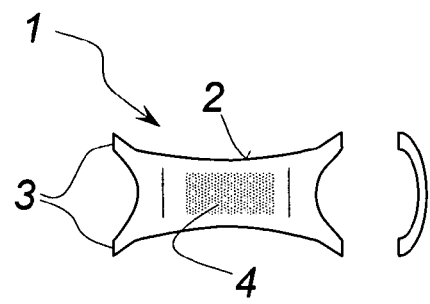
FIG. 7 shows a seventh embodiment of the solder connection element in the form of a one-piece, spherically arched or folded sheet metal part having four solder feet.

Finally, FIG. 7 shows a relatively simple embodiment of the solder connection element 1 in the form of a one-piece sheet metal portion which is spherically arched or rounded off and has four solder feet 3. Here too, in the case of a suitable punched blank of the sheet metal plate, an outwardly or (preferably) inwardly folded solder surface could be provided on each solder foot 3 as in the examples discussed hereinbefore. The upper side of this embodiment again offers sufficient space for a connection surface 4. Contour edges on both sides of this connection surface indicate the arching of the solder connection element.

This spherical arching or folding in both main directions of the solder connection element 1 according to FIG. 7, which is substantially rectangular in its projection (as may be seen from the view tilted through 90°, which would be similar in the other tilting direction), again allows to a sufficient degree compensation for any differences in thermal expansion occurring between the substrate and the solder connection element itself without jeopardizing the quality of the solder joints at the solder feet. Should it prove necessary, spherical arching in the region of the central connection surface can also be leveled or remain flat during (cold) moulding of the solder connection element.

The invention claimed is:

1. A solder connection element soldered on a window pane for connection of an electrical component comprising:
    a body;
    at least two resilient solder feet, wherein the at least two resilient solder feet protrude from the body; and
    the resilient solder feet being adapted to accommodate differences in thermal expansion extending between the body and a surface of the window pane to which the solder connection element is connected, and further being adapted to accommodate effects of mechanical forces between the electrical component and the window pane in at least two coordinate directions parallel to the window pane, wherein:
    the at least two resilient solder feet each comprise a solder surface and a solder foot, the solder surface connecting the body to the solder foot, the solder foot adapted to be soldered on the window pane, the solder foot having a lateral dimension larger than a lateral dimension of the solder surface and laying entirely in a single plane, and
    the body comprises triangular incisions, wherein the incisions lay on a plane parallel to the window pane and are adapted to allow uniform compensation of longitudinal stresses in the body.

2. The solder connection element soldered on a window pane of claim 1,
    wherein the incisions in the body form a plug-in lug for attaching a plug connector.

3. The solder connection element soldered on a window pane of claim 1, wherein the body comprises portions, wherein the portions are deformable for compensating for stresses acting between the at least two resilient solder feet.

4. The solder connection element soldered on a window pane of claim 1, wherein the body comprises a flexible line portion including a plug in contact.

5. The solder connection element soldered on a window pane of claim 1, wherein the body contains a feature selected from the group consisting of a weld, a solder surface, an adhesive surface, a plug-in lug, a plug-in socket, a push-button, and combinations thereof.

6. The solder connection element soldered on a window pane of claim 1, wherein the body, and the at least two resilient solder feet are configured in one piece or a plurality of pieces.

7. The solder connection element soldered on a window pane of claim 1, wherein the solder connection element is connected to at least one fixedly attached flexible conductor portion, wherein the at least one fixedly attached flexible conductor portion contains a plug part at its free end.

8. The solder connection element soldered on a window pane of claim 1, wherein the body is sheathed in its circumference which does not serve as a connection surface with an insulating material.

9. The solder connection element soldered on a window pane of claim 1, wherein the at least two resilient solder feet are arranged at mutually identical or different distances.

10. The solder connection element soldered on a window pane of claim 1, wherein the at least two resilient solder feet contain solder surfaces, wherein the solder surfaces are attached at their body-remote ends or folded down therefrom.

11. The solder connection element soldered on a window pane according to claim 1, wherein the window pane contains glass, polymers or layers or mixtures thereof.

12. The solder connection element soldered on a window pane substrate according to claim 1, wherein the window pane contains a polymer, the polymer containing polycarbonate, polymethyl methacrylate or blends thereof.

13. The solder connection element soldered on a window pane according to claim 1, wherein the window pane is single glazing or double glazing.

14. The solder connection element soldered on a window pane of claim 1, wherein the solder connection element is adapted to accommodate voltages from approximately 12 to 14 volts of DC voltage.

15. The solder connection element soldered on a window pane of claim 1, wherein the solder connection element is adapted to accommodate a current flow of more than 200 amperes.

16. The solder connection element soldered on a window pane of claim 1, wherein the at least two resilient solder feet have a thickness of between 0.01 mm and 0.4 mm.

17. The solder connection element soldered on a window pane of claim 1, wherein the at least two resilient solder feet protrude in a direction substantially normal to the body.

18. The solder connection element soldered on a window pane of claim 1, wherein the at least two resilient solder feet comprise more than two resilient solder feet protruding from opposing sides of the body.

19. The solder connection element soldered on a window pane of claim 1, wherein the at least two resilient solder feet are further adapted to accommodate effects of mechanical forces perpendicularly to the substrate window pane.

20. The solder connection element soldered on a window pane of claim 1, wherein the incisions in the body are arranged on opposite edges of the body.

21. The solder connection element soldered on a window pane of claim 1, wherein the solder connection element is in the form of a spherically arched one-piece sheet metal portion.

* * * * *